United States Patent
Koide et al.

(10) Patent No.: US 6,410,939 B1
(45) Date of Patent: Jun. 25, 2002

(54) SEMICONDUCTOR LIGHT-EMITTING DEVICE AND METHOD OF MANUFACTURING THE SAME

(75) Inventors: Norikatsu Koide; Yoshiyuki Takahira, both of Nara (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/976,390

(22) Filed: Oct. 12, 2001

(30) Foreign Application Priority Data

Oct. 12, 2000 (JP) ........................................ 2000-311613
Apr. 6, 2001 (JP) ........................................ 2001-107963

(51) Int. Cl.[7] ............................................. H01L 27/15
(52) U.S. Cl. ............................ 257/79; 438/22; 438/46; 438/47; 438/28; 438/87; 438/35; 257/86; 257/88; 257/89; 257/103; 257/84; 257/461; 372/43; 372/45; 372/46; 372/44
(58) Field of Search ............................. 257/79, 86, 88, 257/89, 103, 84, 461; 438/22, 28, 35, 46, 47, 87; 372/43, 45, 46, 44

(56) References Cited

U.S. PATENT DOCUMENTS

| | | | | |
|---|---|---|---|---|
| 5,432,808 A | * | 7/1995 | Hatano et al. | 372/45 |
| 5,656,832 A | * | 8/1997 | Ohba et al. | 257/190 |
| 5,751,021 A | * | 5/1998 | Teraguchi | 257/103 |
| 5,764,673 A | * | 6/1998 | Kawazu et al. | 372/45 |
| 5,804,834 A | * | 9/1998 | Shimoyama et al. | 257/22 |
| 5,874,747 A | * | 2/1999 | Redwing et al. | 257/77 |
| 6,045,626 A | * | 4/2000 | Yano et al. | 148/33.4 |
| 6,405,626 | * | 4/2000 | Yano et al. | 148/33.4 |
| 6,081,001 A | * | 6/2000 | Funato et al. | 257/94 |
| 6,100,545 A | * | 8/2000 | Chiyo et al. | 257/98 |
| 6,121,121 A | * | 9/2000 | Koide | 438/481 |
| 6,233,265 B1 | * | 5/2001 | Bour et al. | 372/45 |
| 6,335,217 B1 | * | 1/2002 | Chiyo et al. | 438/46 |
| 6,345,063 B1 | * | 2/2002 | Bur et al. | 372/45 |

FOREIGN PATENT DOCUMENTS

JP 05-343741 A 12/1993
JP 11-145514 5/1999

* cited by examiner

*Primary Examiner*—Matthew Smith
*Assistant Examiner*—Belur V Keshavan
(74) *Attorney, Agent, or Firm*—Morrison & Foerster LLP

(57) ABSTRACT

The present invention provides a semiconductor light-emitting device including a Si substrate, a first clad layer, and an intermediate layer of n-AlInN between the substrate and the first clad layer. The intermediate layer is formed of $Al_xGa_yIn_zN$, wherein $x+y+z=1$, $0 \leq y \leq 0.5$, and $5/95 \leq z/x \leq 40/60$. Thus on the Si substrate there can be provided a nitride-based, light emitting semiconductor device of high quality capable of electrical conduction from the Si substrate.

10 Claims, 3 Drawing Sheets

SEMICONDUCTOR LIGHT-EMITTING DEVICE AND METHOD OF MANUFACTURING THE SAME

BACKGROUND OF THE INVENTION

1. Field of the Invention

The present invention relates generally to nitride-based semiconductor light-emitting devices and particularly to those formed on a Si substrate.

1. Description of the Background Art

Conventionally, quarternary AlGaInN compounds are used to fabricate on a sapphire substrate, a GaN substrate or a SiC substrate a light-emitting device using $In_xGa_{1-x}N$ epitaxial films as a light emitting layer.

A Si substrate is inexpensive, has high quality and also can provide a substrate of a large area and using the Si substrate allows the semiconductor light-emitting device to be fabricated at a cost lower than when a conventional substrate is used.

As a technique used to fabricate a nitride on a Si substrate, Japanese Patent Laying-Open No. 5-343741 discloses that AlN is used as an intermediate layer and thereon the nitride-based semiconductor is grown.

However, the intermediate layer of AlN has high resistance, and inspite that the conductive substrate of Si is used, electric current cannot be introduced from under the substrate through the intermediate layer into the nitiride-based semiconductor.

Accordingly the present inventors tried to use an intermediate layer of AlGaN to provide a level of resistance lower than AlN. Doping an AlGaN layer with Si and growing the same at a high temperature of no less than 1000° C. allowed the grown intermediate layer to have a low resistance. Growing the layer at the high temperature of no less than 1000° C., however, results in the Si substrate having a surface with nitride film formed thereon.

This nitride film has high resistance and it is thus still difficult to introduce electric current from under the Si substrate into the nitride-based semiconductor.

Furthermore, to further reduce the AlGaN layer in resistance the layer needs to have a higher Ga content, although if AlGaN with a large Ga content is provided directly on a Si substrate, at a high temperature Si and Ga react with each other and the Si substrate would have an interface etched, and flat and satisfactory film for semiconductor light-emitting devices can hardly be obtained.

Accordingly the present inventors tried to grow an intermediate layer of AlGaN at low temperature to prevent nitrification of the interface. For an intermediate layer of AlGaN formed at a low temperature of no more than 950° C., semiconductor film formed thereon was hardly flat.

Thus, if an AlGaN layer is used as an intermediate layer, for high-temperature growth the Si substrate would have a nitrided interface and for low-temperature growth the issue of planarity is concerned.

SUMMARY OF THE INVENTION

The present invention has been made to overcome the disadvantages described above. More specifically the present invention contemplates a nitride-based semiconductor device. of high quality fabricated on a Si substrate and capable of electrical conduction from the Si substrate.

The present invention provides a semiconductor light-emitting device including: a Si substrate, a nitride-based semiconductor of a first conductivity type formed successively on the Si substrate, a light emitting layer formed successively on the nitride-based semiconductor of the first conductivity type, and a nitride-based semiconductor of a second conductivity type formed successively on the light emitting layer, wherein between the Si substrate and the nitride semiconductor of the first conductivity type there exists an intermediate layer formed of $Al_xGa_yIn_zN$, wherein x+y+z=1, $0 \leq y \leq 0.5$, and $5/95 \leq z/x \leq 40/60$.

In the present device the intermediate layer is of N-type conductivity.

In the present device the intermediate layer is doped with Si.

In the present device the intermediate layer has an Al content x increased toward the Si substrate.

In the present device the Si substrate has a first electrode receiving electric current in turn passed through the intermediate layer and thus introduced into the light emitting layer to provide light emission.

In the present device the intermediate layer has a thickness in a range of 5 nm to 26 nm.

The present invention provides a method of manufacturing a semiconductor light-emitting device, including the steps of: growing an intermediate layer formed of $Al_xGa_yIn_zN$ on a Si substrate, wherein x+y+z=1, $0 \leq y \leq 0.5$, and $5/95 \leq z/x \leq 40/60$; and growing a nitride-based semiconductor on the intermediate layer.

In the present method the intermediate layer is formed at a temperature of 400° C. to 950° C. it, In the present method the intermediate layer is doped with Si when the intermediate layer is being grown.

In the present method the intermediate layer is grown at a rate in a range of 10 nm/hour to 1000 nm/hour.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention will now be described by describing embodiments of the present invention.

Figure 1:
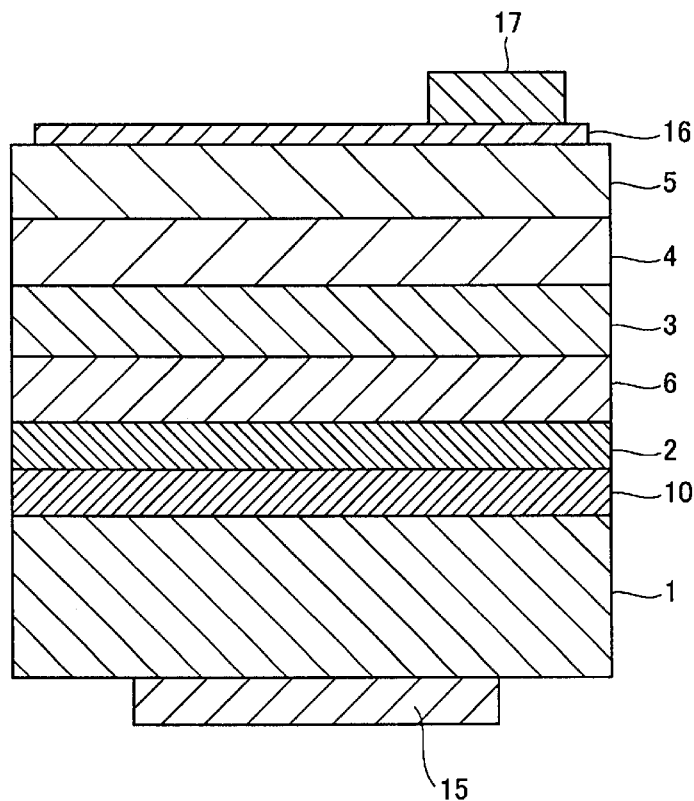
FIG. 1 is a cross section of a light emitting device of an embodiment of the present invention.

With reference to FIG. 1, the present embodiment provides a nitridebased semiconductor light-emitting device including a Si-doped intermediate layer 10 of n-AlInN, a first clad layer 2 of n-GaInN, a multireflection layer 6, a light emitting layer 3 of $In_xGa_{1-x}N$, a carrier block layer 4 of p-AlGaInN, and a second clad layer 5 of p-GaInN wherein they are successively stacked on a Si (silicon) substrate 1.

Furthermore, the Si substrate has a bottom surface provided with an electrode 15 and the second clad layer 5 has an upper surface provided with a transparent electrode 16. A bonding electrode 17 is formed on a part of an upper surface of the transparent electrode 16.

Light emitting layer 3 of $In_xGa_{1-x}N$ can have a content x varying to allow an inter-band light emission wavelength to provide light emission ranging from ultraviolet to red. In the present embodiment, light emission is provided at blue broad band emission.

The magnesium-doped, p-type conductivity second clad layer 5 has large resistance. As such, introducing electric current (holes) simply from bonding electrode 17 to one end of the second clad layer 5 may not provide uniform current density throughout light emitting layer 3 of $In_xGa_{1-x}N$. Accordingly, between bonding electrode 17 and the second clad layer 5 transparent electrode 16 is provided to in the form of thin film extending on substantially the entirety of a surface of the second clad layer 5 to obtain more light emission therefrom. Electrode 15 connected on the Si substrate of n-type conductivity is only required to be formed of metal, desirably containing any of aluminum (Al), titanium (Ti), zirconium (Zr), hafnium (Hf), vanadium (V), and niobium (Nb). Transparent electrode 16 connected to the second clad later 5 of p-GaInN is only required to be formed metal of no more than 20 nm in thickness, desirably containing any of tantalum (Ta), cobalt (Co), rhodium (Rh), nickel (Ni) palladium (Pd), platinum (Pt), copper (Cu), silver (Ag) and gold (Au). The bonding electrode is preferably formed of Au or Al.

The light emitting device of the present embodiment is fabricated by a method as described below:

Etched in $HF:H_2O$, rinsed and dried Si substrate 1 is loaded into a metal organic chemical vapor deposition (MOCVD) equipment and it is cleaned in an ambient of hydrogen ($H_2$) at a high temperature of approximately 1100° C.

Subsequently, a carrier gas of nitrogen ($N_2$) is introduced at a rate of 10 l/min. and meanwhile at 800° C., $NH_3$, trimethylaluminum (TMA) and trimethylindium (TMI) are introduced at rates of 5 l/min., 10 μmol/min., and 17 μmol/min., respectively, and $SiH_4$ gas is further introduced to grow intermediate layer 10 of $Al_{0.85}In_{0.15}N$ having a thickness of approximately 20 nm and doped with Si.

While intermediate layer 10 of AlInN was formed on Si substrate 1 with a uniform indium (In) content in the depth direction, it may have a region with a high Al content in a vicinity of its interface with the Si substrate. For example, the intermediate layer of $Al_{0.85}In_{0.15}N$ having a lower portion provided with a layer having a higher molar fraction of Al, an $Al_{0.95}In_{0.05}N$ layer of 20 nm in thickness, allowed a resultant wafer to have a device structure having a larger area with more satisfactory surface morphology. Furthermore, rather than such a stepwise variation in concentration as described above, a gradual variation in concentration was also similarly effective.

Then at the same temperature the introduction of TMA is stopped and trimethylgallium (TMG) and TMI are introduced at rates of approximately 20 μmol/min. and 100 μmol/min., respectively, to grow the first clad layer 2 of $Ga_{0.92}In_{0.08}N$ having a thickness of approximately 300 nm and doped with Si.

After intermediate layer 10 of AlInN was deposited the temperature for growth may be increased to a high temperature and the first clad layer 2 may be formed of GaN, although, as in the present invention, using the first clad layer containing In and excluding Al, i.e., the first clad layer of GaInN can eliminate the necessity of increasing a temperature for growth to a high temperature and thus allow low-temperature growth to reduce cracks to approximately half the conventional.

Then, at the same temperature for growth as 800° C., $NH_3$, TMA and TMI were introduced at rates of 5 l/min., 10 μmol/min. and 17 μmol/min., respectively, to grow an AlHnN layer of 38 nm in thickness and a source gas of TMG was introduced at a rate of 20 μmol/min. simultaneously into the reactor to grow an AlGaInN layer of 45 nm in thickness. Again the introduction of TMG is stopped and the AlInN layer is thus allowed to be grown to have a thickness of 38 nm.

The gases are switched as described above repeatedly to fabricate multireflection layer 6 of (AlInN/AlGaInN) structured periodically in 10 pairs.

Then the introduction of TMA, TMI, TMG is stopped and the substrate's temperature is decreased to 760° C. and an indium source material or TMI and TMG are introduced at rates of 6.5 μmol/min. and 2.8 mol/min., respectively, to grow a well layer formed of $In_{0.18}Ga_{0.82}N$ and having a thickness of 3 nm. Then again the temperature is increased to 850° C. and TMG is introduced at a rate of 14 μmol/min. to grow a barrier layer of GaN. Well and barrier layers are similarly, repeatedly grown to grow a total of five well layers and a total of five barrier layers sandwiched between well layers and arranged as a top layer to provide light emitting, multiquantum well (MQW) layer 3.

After the light emitting layer is completely grown, then at the same temperature as the last barrier layer TMG at 11 μmol/min., TMA at 1.1 μmol/min., TMI at 40 μmol/min. and a p-type, gaseous doping source material, bis-cyclopentadienyl magnesium ($Cp_2Mg$) at 10μmol/min. are introduced to grow p-type $Al_{0.20}Ga_{0.75}In_{0.05}N$ carrier block layer 4. When carrier block layer 4 is completely grown, then at the same temperature for growth the introduction of TMA is stopped and the p-type second clad layer 5 of $Ga_{0.9}In_{0.1}N$ is thus grown to have a thickness of 80 nm.

Thus a light emitting diode (LED) structure is completely grown and then the introduction of TMG, TMI and $CP_2Mg$ is stopped and the temperature is then reduced to a room temperature and the device is then ejected from the MOCVD equipment. Then, transparent electrode 16 is formed on a top surface of the second clad layer formed of a p-type $Ga_{0.9}In_{0.1}N$ layer and bonding layer 17 is formed thereon at a portion, and electrode 15 is formed on a bottom surface of the Si substrate, to complete the LED of the present embodiment.

The LEDs thus manufactured had electrical characteristic as follows: with the highly conductive Si substrate, for a forward current of 20 mA its drive voltage was 4.0V, which is lower than a conventional LED's drive voltage of 6.0V and thus allows a device to be fabricated with a lower drive voltage.

Thus, if nitride-based semiconductor film (AlInN film) formed of AlN film containing In is grown as an intermediate layer directly on a Si substrate, it can be grown at a temperature lower than a temperature for growth of an intermediate layer of AlGaN and it can be grown to have low resistance, and if with that intermediate layer interposed, GaN nitride-based semiconductor film is formed on the Si substrate, the resultant light emitting, nitride-based semiconductor device can have an interface free of nitride-based film and it can also be sufficiently flat.

Furthermore, the intermediate layer was doped with Si and an electrode was formed on a bottom portion of the Si substrate and a top portion of the GaN film and the LED thus had its electrical characteristics measured and it was found to achieve a further reduced drive voltage of 3.0V. Different n-type dopant, germanium (Ge), oxygen (O) was not effective as Si and a drive voltage of 4.0V was provided, which is a value close to a case with the intermediate layer free of dopant impurity.

The intermediate layer is grown under conditions, as described below:

By introducing TMI, the present inventors have succeeded in growing an intermediate layer providing a satisfactory epitaxial film on Si, at a temperature significantly lower than when the intermediate layer is conventionally formed of AlN.

For the intermediate AlInN layer having an Al content higher than x:z=95:5, wherein x and z represent Al and In contents, respectively, with a large amount of In and a large band gap, if Si is introduced as dopant it was still difficult to obtain of a film exhibiting n-type conductivity and having low resistance and it was thus difficult to flow electric current from Si. For an Al content lower than x:z=60:40, possibly because the film deteriorated in crystallinity, using the intermediate layer to producer nitride-based semiconductor film failed to provide flat film and a semiconductor device structure thus fabricated also did not exhibit satisfactory characteristics. It has thus been found that if a device structure uses an intermediate layer of AlInN satisfying a relationship $40/60 \geq z/x \geq 5/95$ it can be a satisfactory device capable of introduction of electric current from the Si substrate.

Furthermore, in attempting to enhance conductivity, Ga was introduced into the intermediate layer of AlInN. For a Ga content of a large amount, exceeding 50% (y=0.5), a reaction attributed to etching occurred at an interface with Si and the resultant nitride semiconductor film was not flat, and a light emitting semiconductor device thus fabricated was also not a flat film to exhibit satisfactory characteristics.

Figure 3:
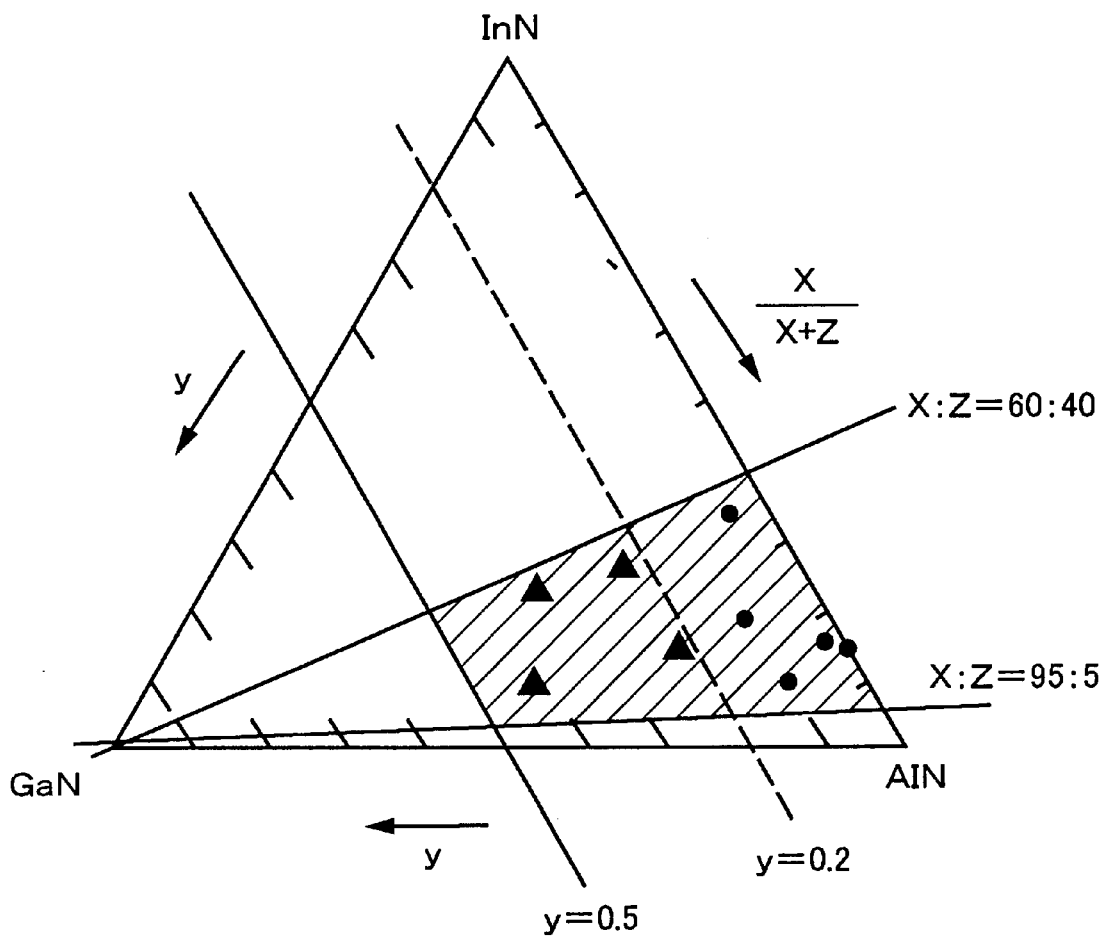
FIG. 3 represents a relationship of components of an intermediate layer of $Al_xGa_yIn_zN$.

FIG. 3 represents the above-described relationship of the intermediate layer of AlGaInN. With reference to FIG. 3, the hatched portion corresponds to a composition allowing a device to have satisfactory characteristics. In the figure the three solid lines are a line for a Ga content of 50% (y=0.5), a line for x:z=60:40, and a line for x:z=95:5. The broken line is a line for a Ga content of 20% (y=0.2). A solid filled circle (○) represents a composition providing a significantly high yield and a solid filled triangle (Δ) represents a composition slightly inferior in yield.

When the intermediate layer was grown at a temperature at least 950° C., In could hardly be added thereto and the film had a high Al content and high resistance.

If the intermediate film is grown at 400° C. or therebelow, it would have poor crystallinity and a nitride-based semiconductor layer thereon serving as an epitaxial layer film failed to obtain a mirror-surface film.

Another embodiment of the present invention will now be described.

Figure 2:
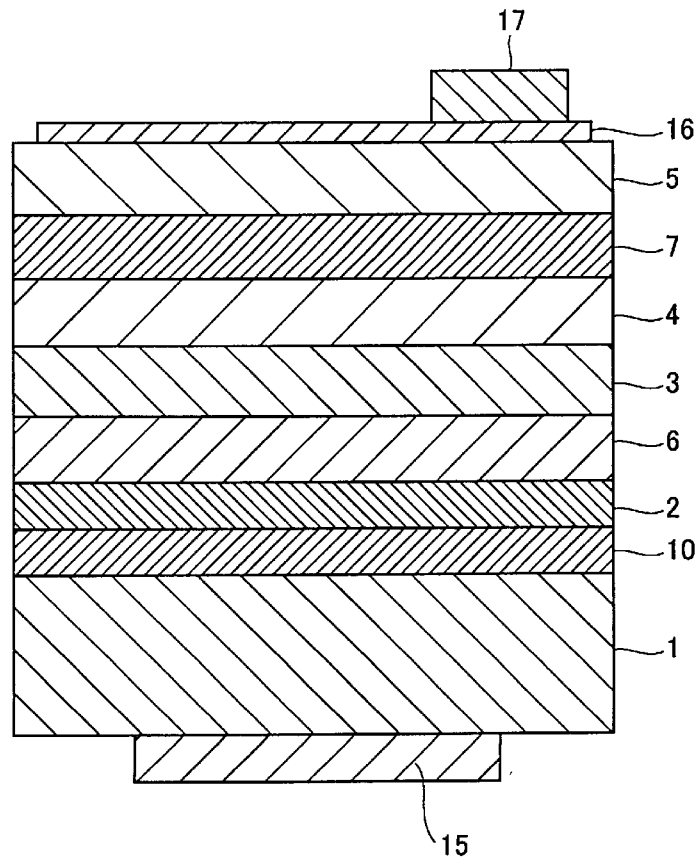
FIG. 2 is a cross section of a light emitting device of a first embodiment of the present invention.

The above embodiment does not include a multireflection layer between an active layer and a top transparent electrode. A reflection film, as described hereinafter, between a carrier block layer and a second clad layer, as shown in FIG. 2, facilitated vertical, multireflection of light to extract light further more efficiently. Note, however, that a top semiconductor reflection film between the second clad layer and the transparent electrode also provided the same result.

The LED is fabricated by a method, as follows: on the light emitting layer as described in the previous embodiment, p-type AlGaInN carrier block layer 4 is grown and subsequently $NH_3$, TMA and TMI are introduced at rates of 5 l/min., 10 μmol/min. and 17 μmol/min., respectively, simultaneously with $Cp_2Mg$, to grow a Mg-doped AlInN layer having a thickness of 38 nm and a gaseous source material of TMG is then introduced at a rate of 20 μmol/min. simultaneously into the reactor to grow a Mg-doped AlGaInN layer having a thickness of 45 nm.

The gases are thus switched repeatedly to manufacture multireflection layer 7 of Mg-doped (AlInN/AlGaInN) periodically structured in five pairs and furthermore the second clad layer 5 of p-type $Ga_{0.9}In_{0.1}N$ is grown to have a thickness of 80 nm to complete the growth of a light emitting device structure.

It should be noted, however, that while upper multireflection layer 7 extracts light upward and also serves as a p-type film, it has high resistance and its periodical structure is increased the device is accordingly increased in resistance. Unlike lower multireflection layer 6, by reducing the number of the periodical pairs of upper multireflection layer 7 the device can be fabricated to be brighter than conventional, without an increased drive voltage.

While in the above embodiment the intermediate layer of AlGaInN is 200 nm thick, the present inventors have conducted a number of experiments and found that changing the thickness of the intermediate layer can enhance crystallinity and thus reduce the number of cracks in the film.

Figure 4:
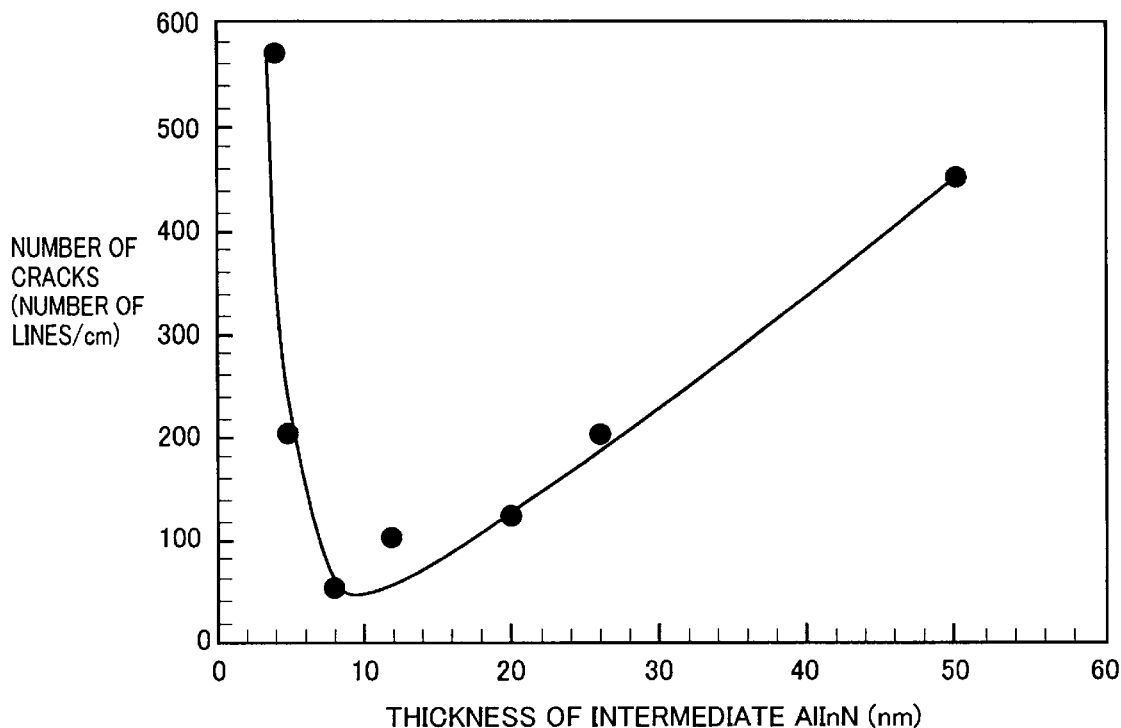
FIG. 4 represents a relationship between a thickness of an intermediate layer and a number of cracks.

FIG. 4 represents a relationship between the thickness of the intermediate AlInN layer and the number of cracks introduced per unit length. As is apparent from the figure, for the intermediate layer of 5 nm to 26 nm in thickness, 200 cracks/cm resulted, which is a significantly smaller value than conventional. If a LED by nitride-based semiconductor has 200 cracks/cm, i.e., an average distance of no less than 50 μm between cracks, normally with a light emission region having a size of a 200 μm×200 μm square, it can thus have the light emission region with no more than several cracks, which, as has been found by the present inventors, does not have a negative effect on the longevity of the device. Thus providing the intermediate layer having a thickness limited in this range succeeded in providing a LED with an increased longevity.

Figure 5:
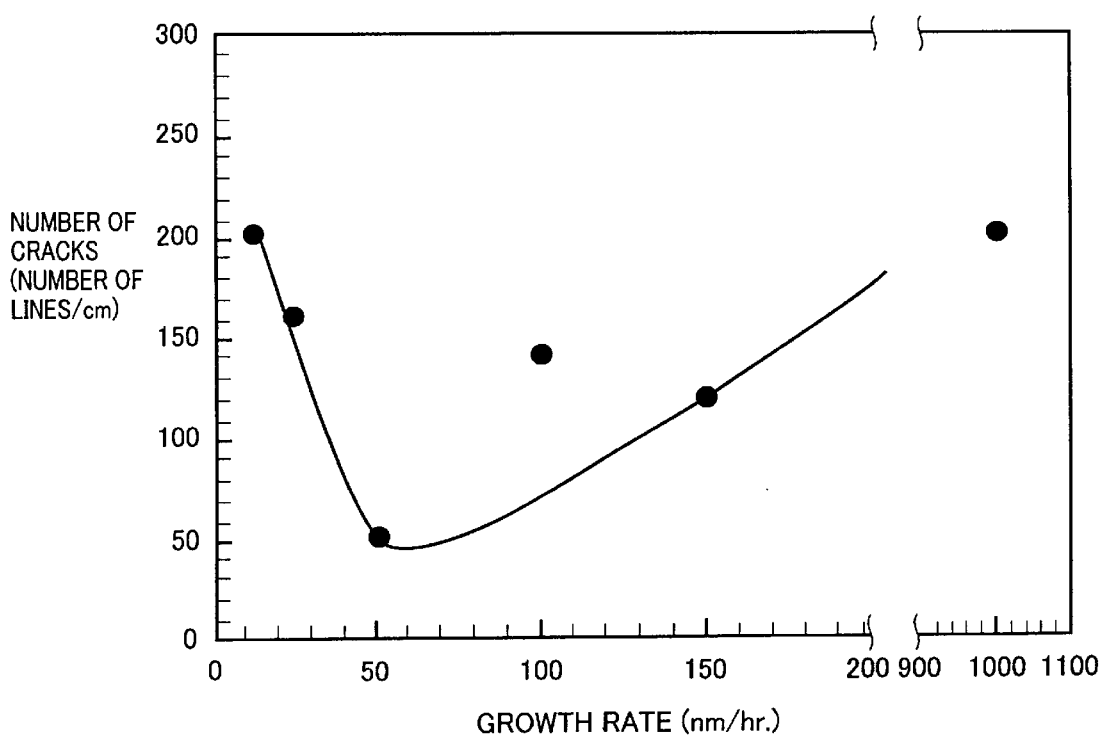
FIG. 5 represents a relationship between a growth rate of an intermediate layer and a number of cracks.

Furthermore, the intermediate layer was grown under various conditions to find an optimal condition. FIG. 5 represents the growth rate of the intermediate layer of AlInN and the number of cracks introduced per unit length. As is apparent from the figure, growing the intermediate AlInN layer at a rate of 10 nm/hour to 1000 nm/hour resulted in 200 cracks/cm, which is a significantly smaller value than conventional. If the intermediate layer is grown at a rate lower than 10 nm/hour to 1000 nm/hour, a Si surface is nitrided while it is being grown and satisfactory epitaxial nitride film cannot be obtained. A growth rate no less than 1000 nm/hour resulted in an increased number of cracks and also gradually failed to provide satisfactory epitaxial growth to provide flat film.

At the growth rate of 10 nm/hour to 1000 nm/hour, an effect similar to that shown in FIG. 4 was achieved to provide a LED having an increased longevity.

While in the above embodiment the intermediate layer is doped with Si, an intermediate layer doped with Ge provides a similar result.

Furthermore, while in the above embodiment a LED is formed on an n-type substrate, it may be formed on a p-type substrate, wherein the intermediate layer is better doped with Mg.

In accordance with the present invention for a LED by nitride-based semiconductor formed on a Si substrate an intermediate AlGaInN layer at least containing Al and In and doped with Si can be grown at a low temperature to allow electric current to be passed directly from the Si substrate.

Although the present invention has been described and illustrated in detail, it is clearly understood that the same is by way of illustration and example only and is not to be taken by way of limitation, the spirit and scope of the present invention.

What is claimed is:

1. A semiconductor light-emitting device comprising a Si substrate, a nitride-based semiconductor of a first conductivity type formed on said Si substrate, a light emitting layer formed on said nitride-based semiconductor of said first conductivity type, and a nitride-based semiconductor of a second conductivity type formed on said light emitting layer, wherein between said Si substrate and said nitride-based semiconductor of said first conductivity type there exists an intermediate layer formed of $Al_xGa_yIn_zN$, wherein $x+y+z=1$, $0 \leq y \leq 0.5$, and $5/95 \leq z/x \leq 40/60$.

2. The semiconductor light-emitting device according to claim 1, wherein said intermediate layer is of n-type conductivity.

3. The semiconductor light-emitting device according to claim 1, wherein said intermediate layer is doped with Si.

4. The semiconductor light-emitting device according to claim 1, wherein said intermediate layer has an Al content x increased toward said Si substrate.

5. The semiconductor light-emitting device according to claim 1, wherein said Si substrate has a first electrode receiving electric current in turn passed through said intermediate layer and thus introduced into said light emitting layer to provide light emission.

6. The semiconductor light-emitting device according to claim 5, wherein said intermediate layer has a thickness in a range of 5 nm to 26 nm.

7. A method of manufacturing a semiconductor light-emitting device, comprising the steps of: growing an intermediate layer formed of $Al_xGa_yIn_zN$ on a Si substrate, wherein $x+y+z=1$, $0 \leq y \leq 0.5$, and $5/95 \leq z/x \leq 40/60$; and growing a nitride-based semiconductor on said intermediate layer.

8. The method of manufacturing the semiconductor light-emitting device according to claim 7, wherein said intermediate layer is formed at a temperature of no less than 400° C. and no more than 950° C.

9. The method of manufacturing the semiconductor light-emitting device according to claim 7, wherein said intermediate layer being grown is doped with Si.

10. The method of manufacturing the semiconductor light-emitting device according to claim 7, wherein said intermediate layer is grown at a rate in a range of 10 nm/hour to 1000 nm/hour.

* * * * *